(12) United States Patent
Kumar et al.

(10) Patent No.: US 7,154,130 B2
(45) Date of Patent: Dec. 26, 2006

(54) SEMICONDUCTOR DEVICE PROVIDED BY SILICON CARBIDE SUBSTRATE AND METHOD FOR MANUFACTURING THE SAME

(75) Inventors: Rajesh Kumar, Nagoya (JP); Florin Udrea, Cambridge (GB); Andrei Mihaila, Cambridge (GB)

(73) Assignee: Denso Corporation, Kariya (JP)

( * ) Notice: Subject to any disclaimer, the term of this patent is extended or adjusted under 35 U.S.C. 154(b) by 100 days.

(21) Appl. No.: 10/776,338

(22) Filed: Feb. 12, 2004

(65) Prior Publication Data

US 2005/0006716 A1 Jan. 13, 2005

(30) Foreign Application Priority Data

Feb. 13, 2003 (JP) .............................. 2003-035404

(51) Int. Cl.
*H01L 29/74* (2006.01)
*H01L 31/111* (2006.01)

(52) U.S. Cl. ....................................... 257/134; 257/135
(58) Field of Classification Search ................ 257/365, 257/134, 135
See application file for complete search history.

(56) References Cited

U.S. PATENT DOCUMENTS

| 5,396,085 | A | 3/1995 | Baliga |
| 6,576,929 | B1 | 6/2003 | Kumar et al. |
| 2002/0034852 | A1* | 3/2002 | Alok .......................... 438/275 |
| 2002/0070409 | A1* | 6/2002 | Yonemaru ................... 257/365 |
| 2004/0070047 | A1* | 4/2004 | Majumdar et al. .......... 257/510 |

FOREIGN PATENT DOCUMENTS

JP A-2002-231820 8/2002

* cited by examiner

*Primary Examiner*—Phat X. Cao
(74) *Attorney, Agent, or Firm*—Posz Law Group, PLC

(57) ABSTRACT

A semiconductor device includes a first field effect transistor including a source and a gate and disposed in a silicon carbide substrate; and a second field effect transistor including a drain and a gate and disposed in the substrate. The drain of the second field effect transistor connects to the source of the first field effect transistor. The gate of the second field effect transistor connects to the gate of the first field effect transistor.

6 Claims, 9 Drawing Sheets

US 7,154,130 B2

SEMICONDUCTOR DEVICE PROVIDED BY SILICON CARBIDE SUBSTRATE AND METHOD FOR MANUFACTURING THE SAME

CROSS REFERENCE TO RELATED APPLICATION

This application is based on Japanese Patent Application No. 2003-35404 filed on Feb. 13, 2003, the disclosure of which is incorporated herein by reference.

FIELD OF THE INVENTION

The present invention relates to a semiconductor device provided by a silicon carbide substrate and a method for manufacturing the same.

BACKGROUND OF THE INVENTION

A metal-oxide semiconductor field-effect transistor (i.e., MOSFET) provided by a silicon carbide substrate (i.e., SiC substrate) has been studied. It is required that the MOSFET works in normally-off operation. Here, the normally-off operation is that no current flows in the MOSFET when a gate voltage is null. However, the MOSFET formed of SiC substrate (e.g., 4H-SiC) has less mobility and less reliability so that the MOSFET is short of performance.

On the other hand, a junction field-effect transistor (i.e., JFET) provided by SiC substrate according to a prior art is disclosed, for example, in U.S. Pat. No. 5,396,085. This JFET is formed of SiC substrate, and works in normally-on operation. Here, the normally-on operation is that a predetermined current flows in the JFET when a gate voltage is null. The JFET has high with stand voltage and low ON-state resistance. Further, a semiconductor device disclosed in the above patent is composed of the JFET and a MOSFET. The JFET is a normally-on operation type transistor and formed of SiC substrate, and the MOSFET has a low withstand voltage and formed of silicon substrate (i.e., Si), so that the device totally works in normally-off operation. Specifically, the MOSFET (i.e., Si-MOSFET) provides high withstand voltage in case of a comparatively low drain voltage (i.e., a low inverse-bias voltage). The JFET (i.e., SiC-JFET) provides high withstand voltage in case of a comparatively high drain voltage (i.e., a high inverse-bias voltage) by expanding a depletion layer in the SiC-JFET.

However, the above device is composed of two transistors, and one is formed of Si substrate and the other is formed of SiC substrate. Accordingly, the device is necessitated to have two chips, i.e., a Si chip and a SiC chip. Therefore, a package for accommodating the device becomes large, and conduction loss of a wiring in the device becomes large. Further, since the device includes the Si-MOSFET, the device does not work in high temperature atmosphere, for example, at a temperature higher than 200° C.

Another device is disclosed in Japanese Unexamined Patent Application publication No. 2003-31591 (i.e., U.S. Pat. No. 6,576,929). The device is composed of two vertical type JFETs combined and integrated in a same substrate made of SiC. One JFET works in a normally-on operation and the other JFET works in a normally-off operation, so that the device totally works in a normally-off operation. However, the device has a complicated construction so that a manufacturing cost of the device becomes large. Further, production tolerance of the device becomes large.

SUMMARY OF THE INVENTION

In view of the above problem, it is an object of the present invention to provide a semiconductor device having SiC substrate. Specifically, the device has high performance, and is manufactured at low cost.

It is another object of the present invention to provide a method for manufacturing a semiconductor device having SiC substrate.

A semiconductor device includes a first field effect transistor including a source and a gate and disposed in a silicon carbide substrate; and a second field effect transistor including a drain and a gate and disposed in the substrate. The drain of the second field effect transistor connects to the source of the first field effect transistor. The gate of the second field effect transistor connects to the gate of the first field effect transistor.

The above device is provided by a single chip, i.e., the same silicon carbide substrate. Accordingly, a package for accommodating the device can be minimized, and conduction loss of a wiring in the device can be reduced. Further, since the device is provided by the silicon carbide substrate, the device can work sufficiently in high temperature atmosphere.

Furthermore, since the device is composed of the lateral type field effect transistor and the junction field effect transistor, the device has a simple construction. Therefore, a manufacturing cost of the device is comparatively small. Further, production tolerance of the device is also small, and the device shows high performance.

Further, the lateral type field effect transistor working in the low voltage controls the junction field effect transistor having high withstand voltage and a low ON-state resistance. Thus, the device, as a whole, has high withstand voltage and is easily controlled, so that the device has high performance.

Preferably, the substrate includes: a first layer made of silicon carbide and heavily doped with a first impurity having a first type conductivity; a second layer made of silicon carbide and lightly doped with the first impurity; and a third layer made of silicon carbide and moderately doped with the first impurity. The second layer is disposed on the first layer, and the third layer is disposed on the second layer. The substrate further includes: a first impurity diffusion region heavily doped with the first impurity; and a second impurity diffusion region heavily doped with a second impurity having a second type conductivity. The second impurity diffusion region is disposed in the second layer near a boundary between the second layer and the third layer, and covers a predetermined area of the boundary. The third layer has first, second and third surface portions, and the first impurity diffusion region is disposed in each of the first, second and third surface portions of the third layer. The first field effect transistor is a vertical type junction field effect transistor having the source, the gate, a drain and a channel. The source of the first field effect transistor is the first impurity diffusion region disposed in the first surface portion, the drain of the first field effect transistor is the first layer, the gate of the first field effect transistor is the second impurity diffusion region, and the channel of the first field effect transistor is a part of the second layer near the boundary between the second layer and the third layer, the part of the second layer not being covered with the second type impurity diffusion region. The second field effect transistor is a lateral type junction field effect transistor having a source, the gate, the drain and a channel. The source of the second field effect transistor is the first impurity diffusion region disposed in the second surface portion, the drain of the second field effect transistor is the first impurity diffusion region disposed in the third surface portion, the gate of the second field effect transistor is the second impurity diffusion region, and the channel of the second field effect transistor is the third layer. The second surface portion separates from the third surface portion.

More preferably, the device further includes a separation disposed in the third layer and reaches the second impurity diffusion region. The separation separates the third layer into a first part and a second part. The source of the first field effect transistor is disposed in the first part, and the second field effect transistor is disposed in the second part. In this case, the separation prevents a mutual interference between the junction field effect transistor and the lateral type field effect transistor.

Furthermore preferably, the second impurity diffusion region covers almost whole area of the boundary between the second layer and the third layer except for the channel of the first field effect transistor. The second impurity diffusion region separates between the second part and the second layer. In this case, a noise generated in the junction field effect transistor is prevented from penetrating into the second part, so that the lateral type field effect transistor disposed in the second part is protected from the noise.

Further, a semiconductor device includes a first field effect transistor having a source and a gate and disposed in a silicon carbide substrate; and a second field effect transistor having a drain and a source and disposed in the substrate. The drain of the second field effect transistor connects to the source of the first field effect transistor. The source of the second field effect transistor connects to the gate of the first field effect transistor.

In the above device, a package for accommodating the device can be minimized, and conduction loss of a wiring in the device can be reduced. The device can work sufficiently in high temperature atmosphere. Further, the device has a simple construction, so that a manufacturing cost of the device is comparatively small. Further, production tolerance of the device is also small, and the device shows high performance. Furthermore, the device has high withstand voltage and is easily controlled, so that the device has high performance.

Preferably, the substrate includes: a first layer made of silicon carbide and heavily doped with a first impurity having a first type conductivity; a second layer made of silicon carbide and lightly doped with the first impurity; and a third layer made of silicon carbide and moderately doped with the first impurity. The second layer is disposed on the first layer, and the third layer is disposed on the second layer. The substrate further includes: a first impurity diffusion region heavily doped with the first impurity; and a second impurity diffusion region heavily doped with a second impurity having a second type conductivity. The second impurity diffusion region is disposed in the second layer near a boundary between the second layer and the third layer, and covers a predetermined area of the boundary. The third layer has first, second and third surface portions, and the first impurity diffusion region is disposed in each of the first, second and third surface portions of the third layer. The first field effect transistor is a vertical type junction field effect transistor having the source, the gate, a drain and a channel. The source of the first field effect transistor is the first impurity diffusion region disposed in the first surface portion, the drain of the first field effect transistor is the first layer, the gate of the first field effect transistor is the second impurity diffusion region, and the channel of the first field effect transistor is a part of the second layer near the boundary between the second layer and the third layer, the part of the second layer not being covered with the second type impurity diffusion region. The second field effect transistor is a lateral type accumulation mode field effect transistor having the source, a gate, the drain and a channel. The source of the second field effect transistor is the first impurity diffusion region disposed in the second surface portion, the drain of the second field effect transistor is the first impurity diffusion region disposed in the third surface portion, the gate of the second field effect transistor is provided by an electrode disposed on the third layer through an insulation film and disposed between the second and third surface portions, and the channel of the second field effect transistor is the third layer. The second surface portion separates from the third surface portion.

Preferably, the substrate includes: a first layer made of silicon carbide and heavily doped with a first impurity having a first type conductivity; a second layer made of silicon carbide and lightly doped with the first impurity; and a third layer made of silicon carbide and moderately doped with the first impurity. The second layer is disposed on the first layer, and the third layer is disposed on the second layer. The substrate further includes: a first impurity diffusion region heavily doped with the first impurity having the first type conductivity; a second impurity diffusion region heavily doped with a second impurity having a second type conductivity; and a third impurity diffusion region moderately doped with the second impurity. The second impurity diffusion region is disposed in the second layer near a boundary between the second layer and the third layer, and covers a predetermined area of the boundary. The third layer has first, second and third surface portions, and the third impurity diffusion region is disposed in a fourth surface portion of the third layer. The first impurity diffusion region is disposed in each of the first, second and third surface portions of the third layer. The first field effect transistor is a vertical type junction field effect transistor having the source, the gate, a drain and a channel. The source of the first field effect transistor is the first impurity diffusion region disposed in the first surface portion, the drain of the first field effect transistor is the first layer, the gate of the first field effect transistor is the second impurity diffusion region, and the channel of the first field effect transistor is a part of the second layer near the boundary between the second layer and the third layer, the part of the second layer without covering with the second impurity diffusion region. The second field effect transistor is a lateral type inverse mode field effect transistor having the source, a gate, the drain and a channel. The source of the second field effect transistor is the first impurity diffusion region disposed in the second surface portion, the drain of the second field effect transistor is the first impurity diffusion region disposed in the third surface portion, the gate of the second field effect transistor is provided by an electrode disposed on the third impurity diffusion region through an insulation film and disposed between the second and third surface portions, and the channel of the second field effect transistor is the third impurity diffusion region. The second surface portion separates from the third surface portion, and the second and third surface portions contact the third impurity diffusion region.

Further, a method for manufacturing a semiconductor device is provided. The device includes a lateral type field effect transistor and a vertical type junction field effect transistor, which are integrated in a silicon carbide substrate. The method includes the steps of: preparing a first layer made of silicon carbide and heavily doped with a first impurity having a first type conductivity, the first layer being to be a drain of the junction field effect transistor; forming a second layer on the first layer, the second layer being made of silicon carbide and lightly doped with the first impurity and to be a channel of the junction field effect transistor; forming a second impurity diffusion region heavily doped with a second impurity having a second type conductivity, disposed in a predetermined surface portion of the second layer, and being to be a gate of the junction field effect transistor; forming a third layer made of silicon carbide, moderately doped with the first impurity, and disposed on both of the second layer and the second impurity diffusion region; and forming a first impurity diffusion region heavily doped with the first impurity, disposed in each of first, second third surface portions of the third layer, and being to be a source of the junction field effect transistor and a source and drain of the lateral type field effect transistor, respectively.

In the above device, a package for accommodating the device can be minimized, and conduction loss of a wiring in the device can be reduced. The device can work sufficiently in high temperature atmosphere. Further, the device has a simple construction, so that a manufacturing cost of the device is comparatively small. Further, production tolerance of the device is also small, and the device shows high performance. Furthermore, the device has high withstand voltage and is easily controlled, so that the device has high performance.

BRIEF DESCRIPTION OF THE DRAWINGS

The above and other objects, features and advantages of the present invention will become more apparent from the following detailed description made with reference to the accompanying drawings. In the drawings.

DETAILED DESCRIPTION OF THE PREFERRED EMBODIMENTS (First Embodiment)

Figure 1:
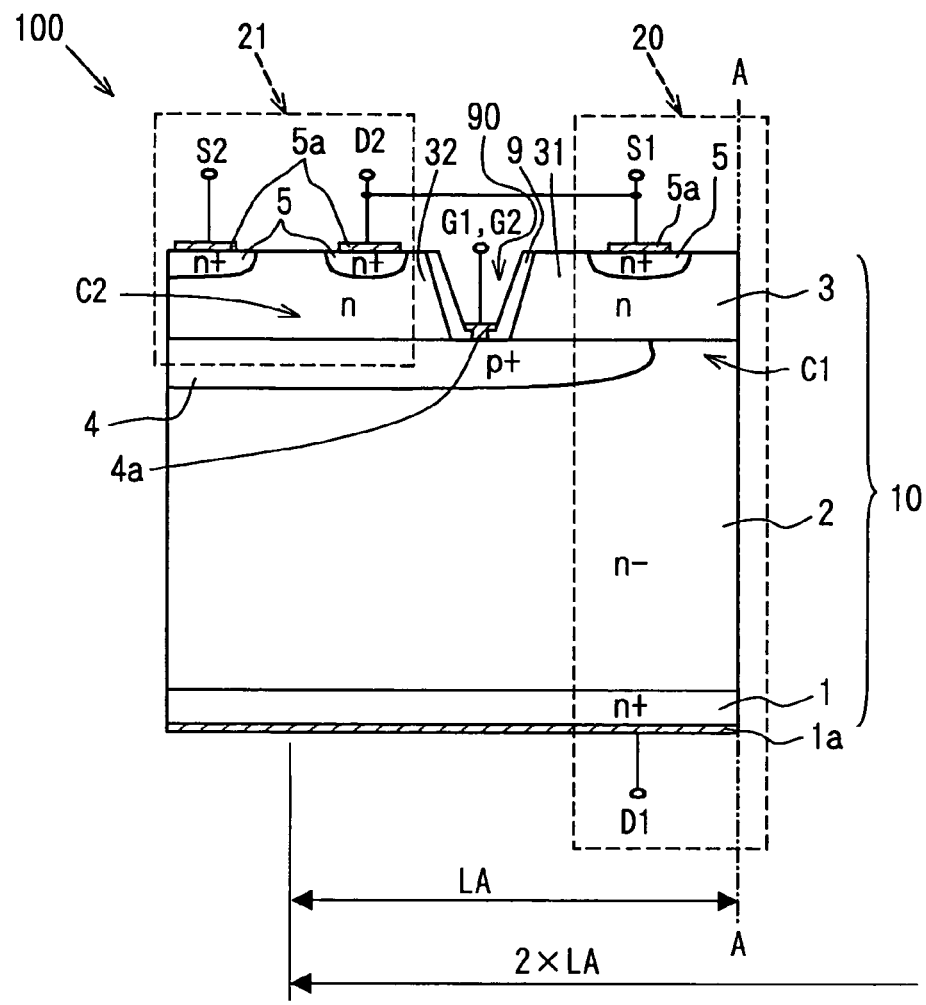
FIG. 1 is a cross-sectional view showing a semiconductor device according to a first embodiment of the present invention.
Figure 2:
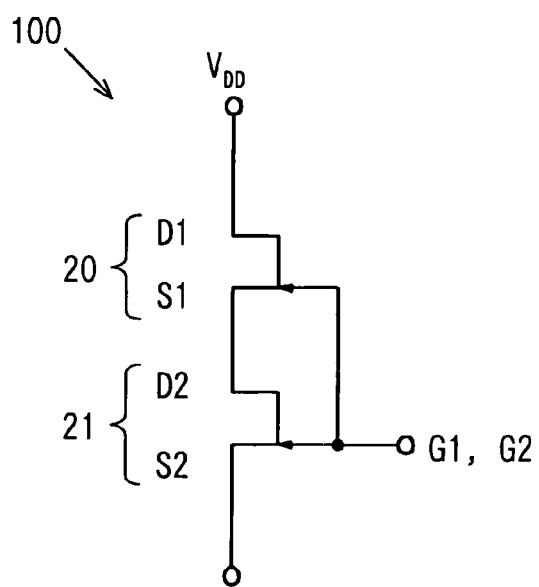
FIG. 2 is an equivalent circuit diagram of the device according to the first embodiment.

A semiconductor device 100 according to a first embodiment of the present invention is shown in FIGS. 1 and 2. FIG. 2 is an equivalent circuit diagram corresponding to the device 100. The device 100 includes a vertical type junction field effect transistor (i.e., V-JFET) 20 and a lateral type junction field effect transistor (i.e., L-JFET) 21, which are formed (i.e., integrated) in a semiconductor substrate 10 made of silicon carbide (i.e., SiC). In FIG. 1, half of the V-JFET 20 is shown, so that the whole V-JFET 20 is divided with a symmetry axis of line A—A in FIG. 1. Here, the device 100 is composed of a plurality of units. Each unit is provided by doubling a region shown as LA in FIG. 1. Specifically, the region LA is doubled so as to reverse with the symmetry axis A—A so that the unit is provided. Therefore, the unit has a length of twice of the region LA (i.e., 2×LA). On the contrary, the unit is folded with the symmetry axis A—A so that the region LA is provided, as shown in FIG. 1. Thus, the unit has line symmetry. The device 100 is provided by repeating the unit.

The semiconductor substrate 10 includes the first layer 1 having N$^+$ type conductivity, the second layer 2 having N$^-$ type conductivity and the third layer 3 having N type conductivity. The N$^-$ type second layer is disposed on the N$^+$ type first layer 1, and the N type third layer 3 is disposed on the second layer 2. These first, second and third layer are made of SiC. A P$^+$ type impurity diffusion region 4 having P$^+$ type conductivity is disposed in the second layer 2 near a boundary between the second layer 2 and the third layer 3. The diffusion region 4 covers a predetermined part of the boundary, i.e., covers a predetermined surface portion of the second layer 2. A N$^+$ type impurity diffusion region 5 having N$^+$ type conductivity is disposed in the third layer 3, specifically, disposed in a predetermined surface portion of the third layer 3.

In the V-JFET 20, the N$^+$ type impurity diffusion region 5 works as a source S1, the N$^+$ type first layer 1 works as a drain D1, and the P$^+$ type impurity diffusion region 4 works as a gate G1. Further, a region C1, which is disposed on the boundary between the N$^-$ type second layer 2 and the N type third layer 3 and is not covered with the P$^+$ type impurity diffusion region 4, works as a channel C1.

In the L-JFET 21, two N$^+$ type impurity diffusion regions 5 separately disposed in the surface portion of the third layer 3 work as a source S2 and a drain D2, respectively. The P$^+$ type impurity diffusion region 4, which is the same part as the V-JFET 20, works as a gate G2. The N type third layer 3 works as a channel C2.

In FIG. 1, an electrode 1a is disposed on the first layer 1, three electrodes 5a are disposed on the N$^+$ impurity diffused region 5 and an electrode 4a is disposed on the P$^+$ impurity diffused region 4. An insulator 9 is disposed on a sidewall surface of a separation 90. The separation 90 reaches the P$^+$ impurity diffusion region 4. The insulator 9 includes a via hole for connecting the electrode 4a to the P$^+$ impurity diffusion region 4.

In the semiconductor device 100, the drain D2 of the L-JFET 21 connects to the source S1 of the V-JFET 20. The gate G1 of the V-JFET 20 and the gate G2 of the L-JFET 21 are common and formed on the P+ impurity diffusion region 4. Therefore, in FIG. 1, the gate G1 of the V-JFET 20 and the gate G2 of the L-JFET 21 are shown as the same line and connect each other.

Thus, the device 100 is provided such that the V-JFET 20 and the L-JFET 21 are combined and integrated in the same SiC substrate 10. Further, the drain D2 of the L-JFET 21 connects to the source S1 of the V-JFET 20, and the gate G2 of the L-JFET 21 connects to the gate G1 of the V-JFET 20, so that the device 100 works as a three-terminal device. Further, the device 100 is provided by a single chip, which is composed of one SiC substrate 10. Accordingly, a package for accommodating the device 100 can be minimized, and conduction loss of a wiring in the device 100 can be reduced. Further, since the device 100 does not include Si based device such as Si-MOSFET, the device can work sufficiently in high temperature atmosphere, for example, at a temperature higher than 200° C.

Furthermore, since the device 100 is composed of the L-JFET 21 and the V-JFET 20, the device 100 has a simple construction compared with a device composed of two V-JFETs. Therefore, a manufacturing cost of the device 100 is comparatively small. Further, production tolerance of the device 100 is also small, and the device 100 shows high performance.

In the third layer 3 of the device 100, the separation 90 having the insulator 9 disposed on the sidewall of the separation 90 is formed. The separation 90 reaches the P$^+$ impurity diffusion region 4. The separation 90 divides the third layer 3 of the device 100 into two regions. One is the first region 31 including the source S1 of the V-JFET 20, and the other is the second region 32 including the L-JFET 21. Therefore, the separation 90 prevents a mutual interference between the V-JFET 20 and the L-JFET 21.

The P$^+$ impurity diffusion region 4 covers almost the whole area of the boundary between the second layer 2 and the third layer 3 except for the channel C1 of the V-JFET 20. Therefore, the P$^+$ impurity diffusion region 4 separates the second region 32 from the second layer 2. Accordingly, a noise generated in the V-JFET 20 is prevented from penetrating into the second region 32, so that the L-JFET 21 disposed in the second region 32 is protected from the noise.

As shown in FIG. 2, the L-JFET 21 works in a low voltage compared with the V-JFET 20. Specifically, the L-JFET 21 working in the low voltage controls the V-JFET 20 having high withstand voltage and a low ON-state resistance. Thus, the device 100, as a whole, has high withstand voltage and is easily controlled. Further, the device 100 has high performance.

Figure 3A:
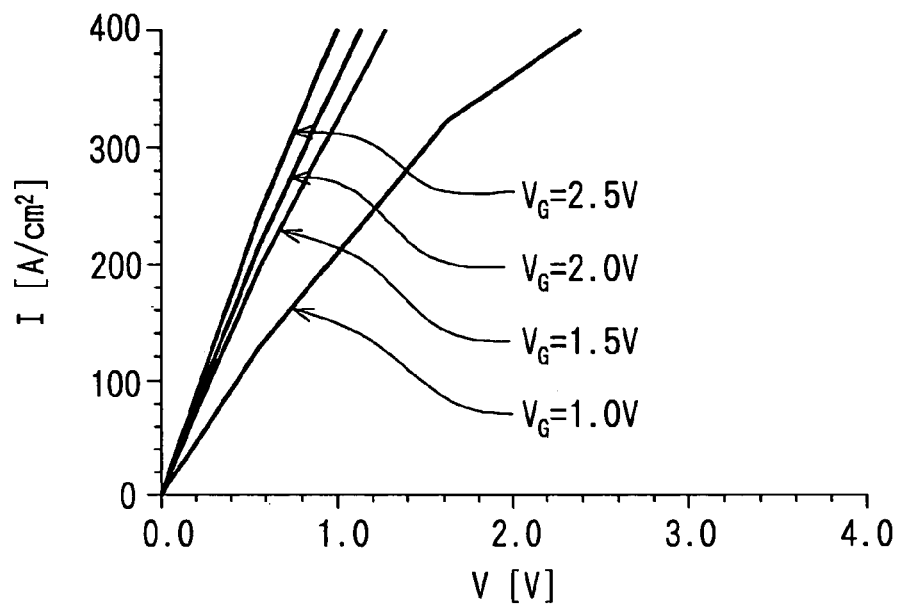
FIGS. 3A and 3B are graphs showing a relationship between current and voltage of the device in an on-state and in an off-state, respectively, according to the first embodiment.
Figure 3B:
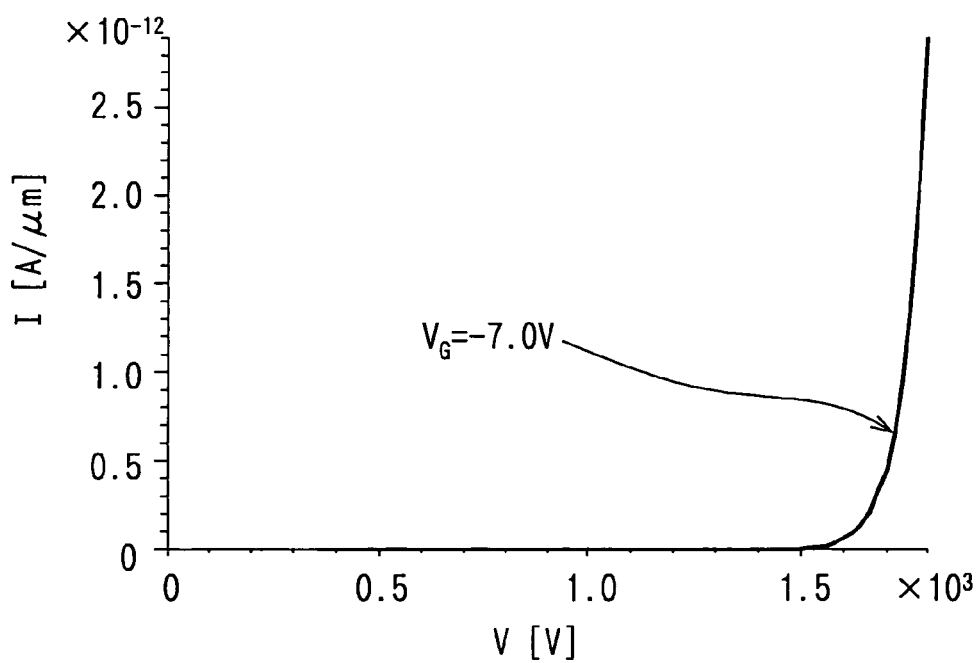

FIGS. 3A and 3B is graphs showing a relationship between current I and voltage V of the device 100, which is obtained by a simulation result. FIG. 3A shows the relationship in a case where the device 100 is in an on-state. Each curve in FIG. 3A is obtained by a gate voltage $V_G$ of 1.0V, 2.0V and 2.5V, respectively. FIG. 3B shows the relationship in a case where the device 100 is in an off-state. A curve in FIG. 3B is obtained by the gate voltage $V_G$ of −7.0V. Here, the voltage $V_G$ is applied to the gate G1, G2. Thus, when the gate voltage $V_G$ becomes negative, the device 100 becomes the off-state. Therefore, the device 100 totally works in a normally-off operation and works as the three-terminal device.

Figure 4:
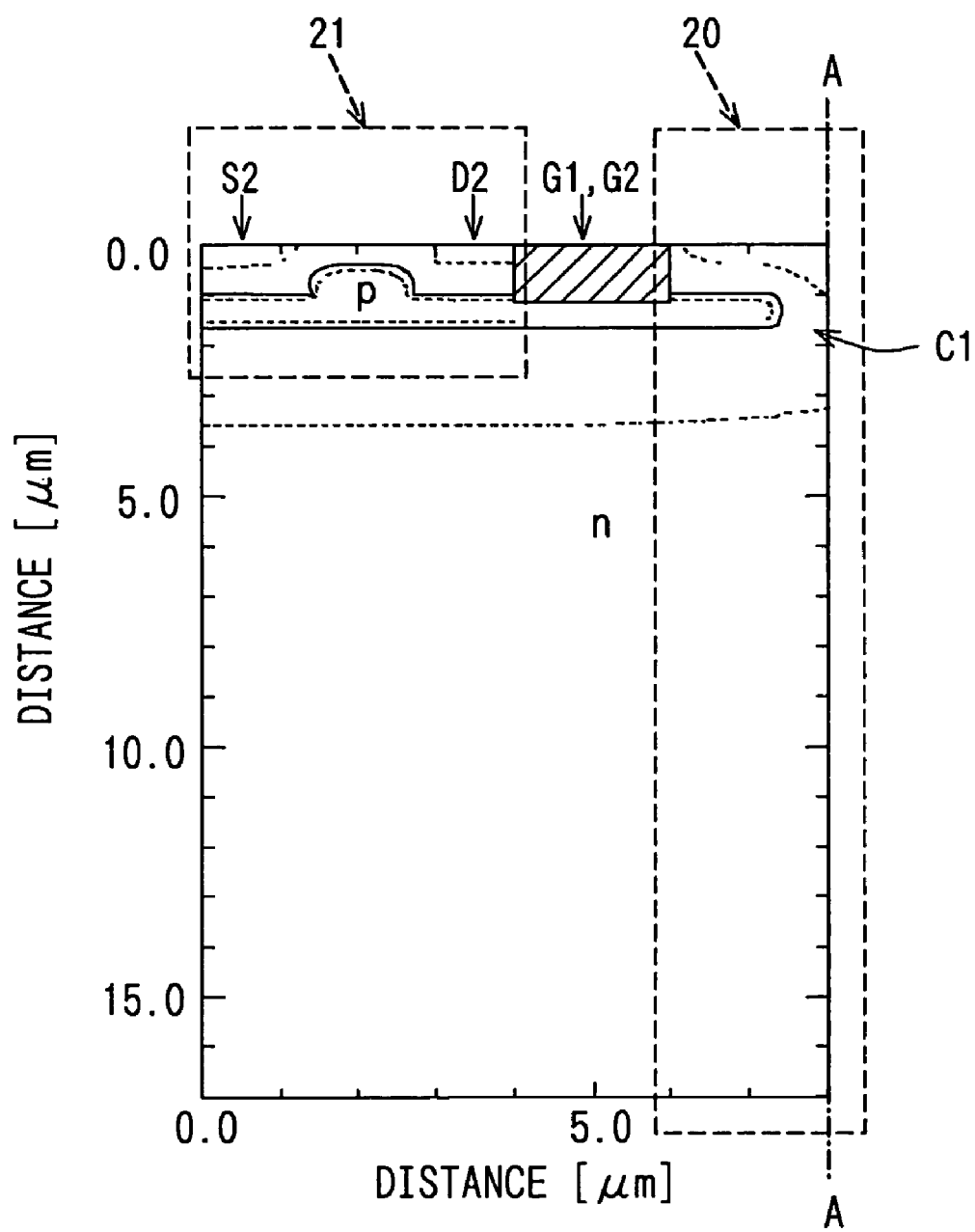
FIG. 4 is a cross-sectional view explaining a depletion layer in the device according to the first embodiment.

FIG. 4 shows a depletion layer in the device 100, which is obtained by a simulation result. Here, the gate voltage $V_G$ is −7.0V, and the drain voltage $V_{D1}$ of the drain D1 of the V-JFET 20 is 10V. In FIG. 4, a dot line disposed on both sides of a P-N boundary (i.e., the boundary between the second layer 2 and the third layer 3) shows a region of the depletion layer expanding in the second and third layers 2, 3. As shown in FIG. 4, when the gate voltage $V_G$ is −7.0V, the depletion layer completely blocks the channel C1 of the V-JFET 20 since the depletion layer expands wider, so that the device 100 becomes the off-state.

Further, other results of the depletion layer are obtained with various values of gate voltage $V_G$ and drain voltage $V_{D1}$ by the simulation results. That shows the channel C1 of the V-JFET 20 is blocked completely in a case where the gate voltage $V_G$ is about −3.0V. When the gate voltage $V_G$ is −7.0V, the depletion layer expands more widely as the drain voltage $V_{D1}$ becomes higher. Therefore, in a case where the drain voltage $V_{D1}$ becomes larger, the depletion layer completely blocks the channel C1.

Figure 5:
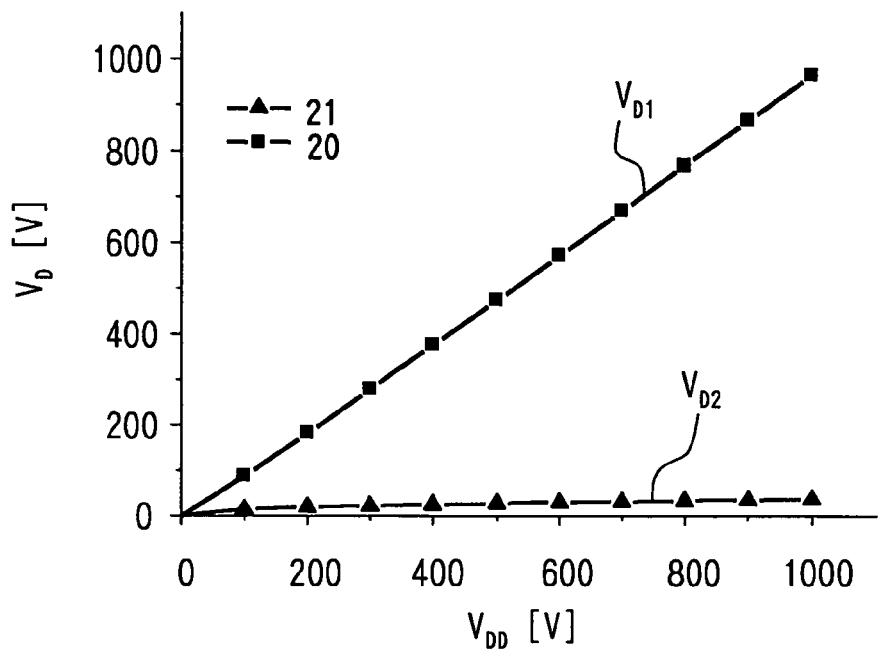
FIG. 5 is a graph showing a relationship between a drain voltage $V_D$ and a total drain voltage $V_{DD}$.

FIG. 5 shows a relationship between drain voltages $V_{D1}$, $V_{D2}$ and a total drain voltage $V_{DD}$, respectively. Each drain voltage $V_{D1}$, $V_{D2}$ is applied to the drain D1, D2 of the V-JFET 20 or the L-JFET 21, respectively. The total drain voltage $V_{DD}$ is obtained by adding the drain voltages $V_{D1}$, $V_{D2}$. As the total drain voltage $V_{DD}$ becomes larger, the drain voltage $V_{D1}$ becomes much larger, so that the V-JFET 20 is applied with high voltage. However, the L-JFET 21 is applied with a comparatively low voltage. Accordingly, in the device 100, the L-JFET 21 can be operated in a low voltage.

Figure 6:
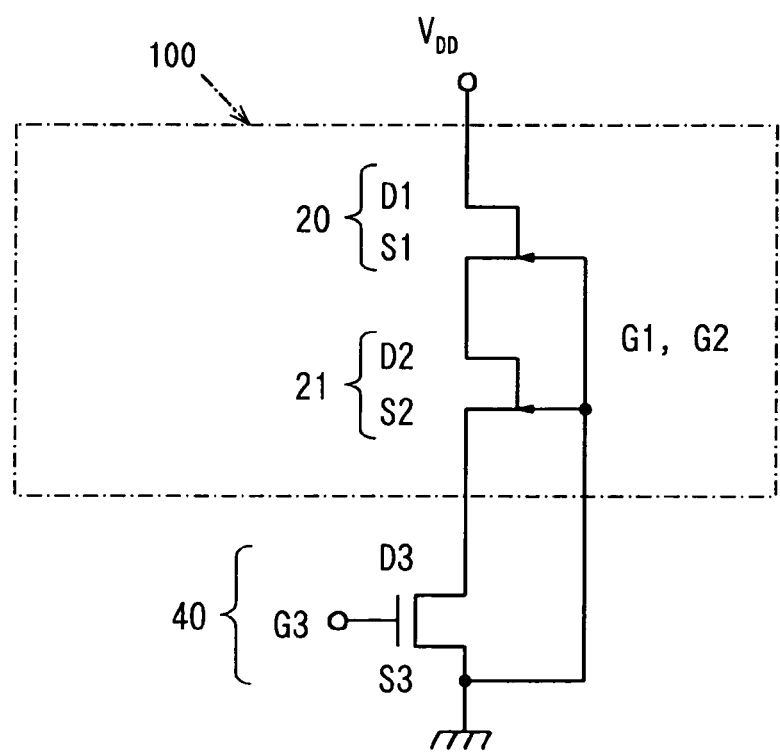
FIG. 6 is an equivalent circuit diagram of the device with a Si-MOSFET, according to the first embodiment.

The device 100 can be controlled with another chip, as shown in FIG. 6. The other chip is a Si-MOSFET 40, which is provided by silicon substrate, and connects to the device 100 for controlling the device 100. In FIG. 6, a part surrounded with a dash-dotted line shows the device 100. A drain D3 of the Si-MOSFET 40 connects to the source S2 of the L-JFET 21. A source S3 of the Si-MOSFET 40 connects to the gate G1, G2 of the V-JFET 20 and L-JFET 21, so that the gate G1, G2 is applied with an inverse bias voltage. Thus, the device 100 is controlled with the Si-MOSFET 40. Accordingly, the device 100 with the Si-MOSFET 40 works in the normally-off operation and works as the three-terminal device.

In FIG. 6, since the Si-MOSFET 40 connects to the device 100, the device 100 can be operated in much lower voltage, compared with the device 100 without the Si-MOSFET 40. Specifically, the device 100 with the Si-MOSFET 40 has higher withstand voltage. Preferably, the Si-MOSFET 40 becomes the on-state when a gate voltage $V_G$ of a gate G3 in the Si-MOSFET 40 is in a range between 5V and 10V. In this case, the device 100 is controlled in a certain voltage, for example, the voltage used in a logic circuit through the Si-MOSFET 40. Thus, a whole circuit in the device 100 can be minimized. Further, the Si-MOSFET 40 is the other Si chip, which is different from the SiC chip composing the device 100, so that the other Si chip is manufactured at a comparatively low cost. Therefore, an additional manufacturing cost for adding the Si-MOSFET 40 is suppressed since the other Si chip is the low cost chip.

Next, the device 100 is manufactured as follows.

Figure 7A:
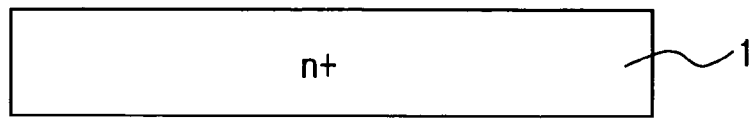
FIGS. 7A to 7C are cross-sectional views explaining a manufacturing method of the device according to the first embodiment.

At first, as shown in FIG. 7A, a silicon carbide (i.e., SiC) substrate as the N$^+$ first layer 1 is prepared. The SiC substrate 1 includes N type impurities in high concentration (i.e., the SiC substrate 1 is heavily doped with N type impurities).

Figure 7B:
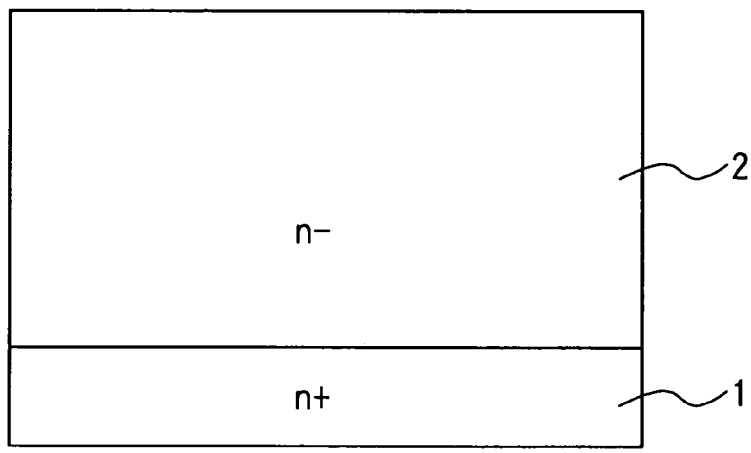

Then, a SiC layer as the N$^-$ second layer 2 is deposited with using an epitaxial growth method, as shown in FIG. 7B. The SiC layer 2 includes N type impurities in low concentration (i.e., the SiC layer 2 is lightly doped with N type impurities).

Figure 7C:
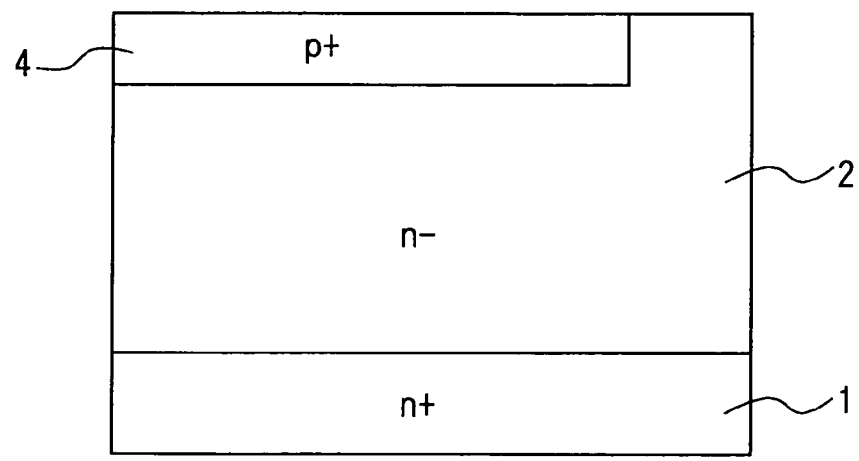

As shown in FIG. 7C, P type impurities are heavily doped into a predetermined area of a surface of the SiC layer 2 with using an ion implantation method, so that the P+ impurity diffusion region 4 is formed. The P+ impurity diffusion region 4 is disposed around a predetermined area, which becomes the boundary between the second layer 2 and the third layer 3. Here, the P+ impurity diffusion region 4 can be formed such that the P impurities is implanted deeply with using high energy ion implantation method after the third layer 3 is formed as described below.

Figure 8A:
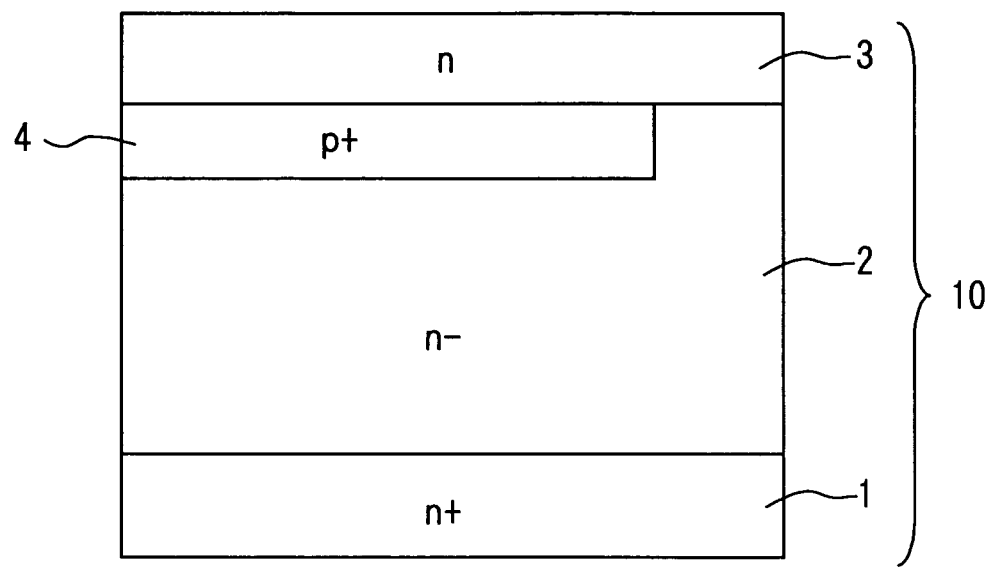
FIGS. 8A and 8B are cross-sectional views explaining the manufacturing method of the device according to the first embodiment.

Next, as shown in FIG. 8A, another silicon carbide layer as the N type third layer 3 is deposited with using the epitaxial growth method. The SiC layer 3 includes N type impurities in moderate concentration (i.e., the SiC layer 3 is moderately doped with N type impurities). Thus, the SiC substrate 1, the SiC layer 2 and the SiC layer 3 compose the semiconductor substrate 10.

Figure 8B:
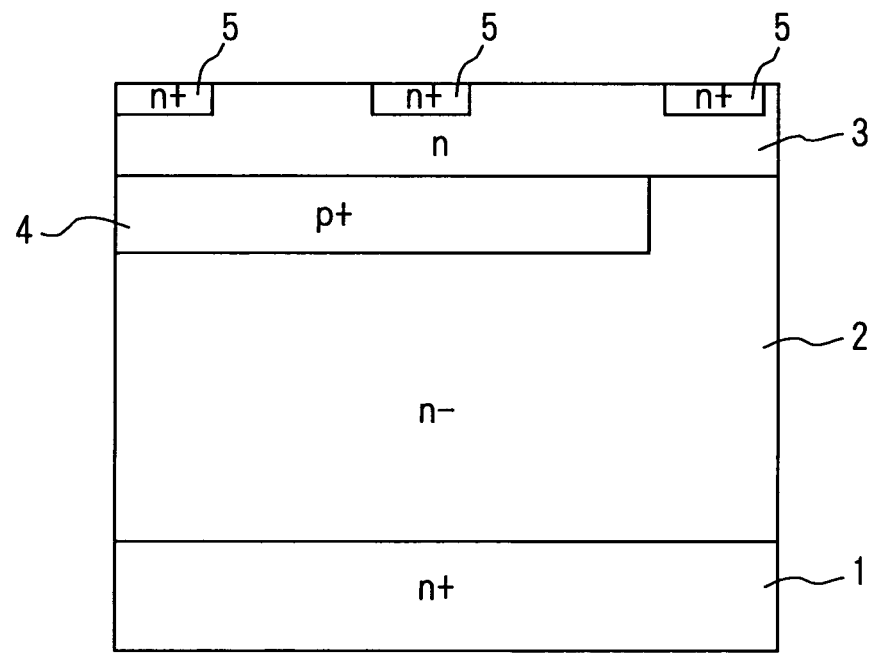

As shown in FIG. 8B, N type impurities are heavily doped into a predetermined area of a surface of the silicon carbide layer 3 with using the ion implantation method, so that the N+ impurity diffusion region 5 is formed. The N+ impurity diffusion region 5 is disposed in the surface of the third layer 3.

Figure 9A:
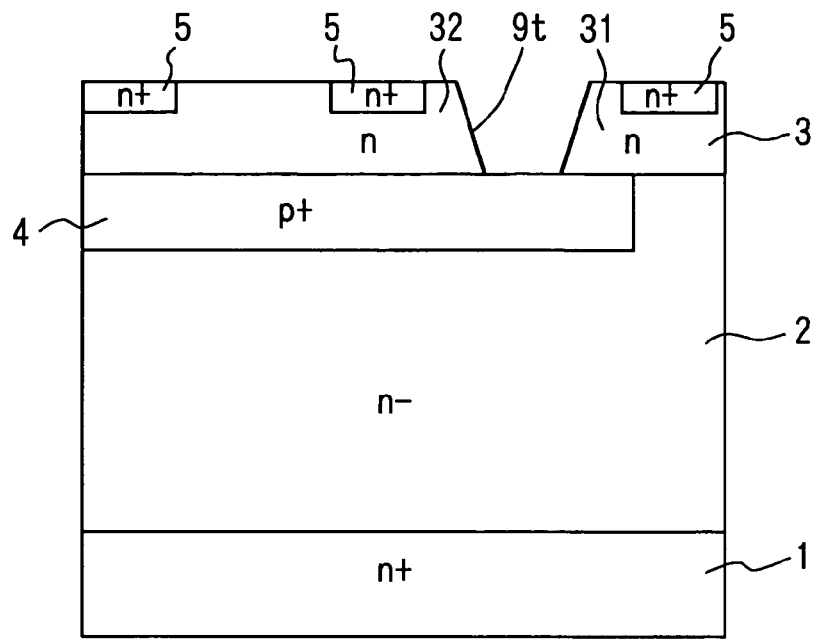
FIGS. 9A and 9B are cross-sectional views explaining the manufacturing method of the device according to the first embodiment.
Figure 9B:
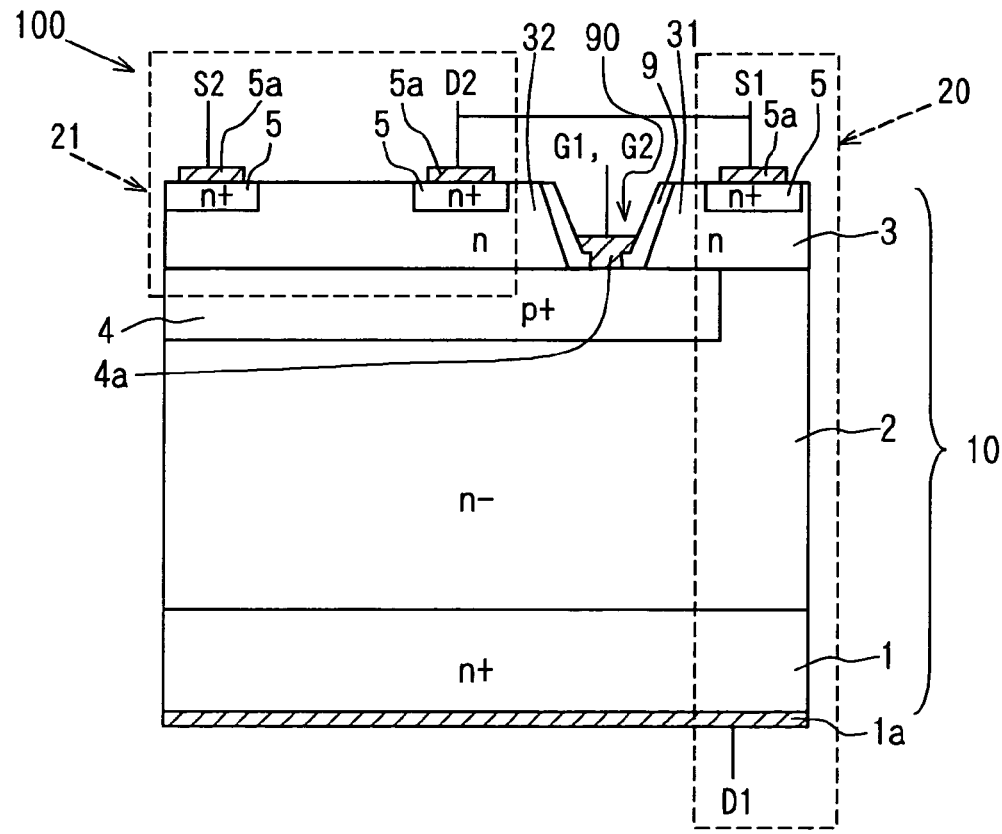

Next, the SiC layer 3 is mesa-etched to reach the P+ impurity diffusion region 4 so that a trench 9t is formed. Thus, the third layer 3 is separated into the first region 31 and the second region 32. Then, as shown in FIG. 9B, the insulator 9 is formed on the sidewall surface of the trench 9t so that the separation 90 is completed.

Then, the via hole is formed in the insulator 9, and then the electrodes 1a, 4a, 5a are formed for the SiC substrate 1, the P+ impurity diffusion region 4 and the N+ impurity diffusion region 5, respectively. In FIG. 9B, the electrode 5a of the drain D2 of the L-JFET 21 and the electrode 5a of the source S1 of the V-JFET 20 are connected each other.

Thus, the device 100 is completed. The manufacturing method for manufacturing the device 100 composed of the L-JFET 21 and the V-JFET 20 is simple, compared with that of the device composed of two V-JFETs. Therefore, the device 100 can be manufactured at low cost.

(Second Embodiment)

Figure 10:
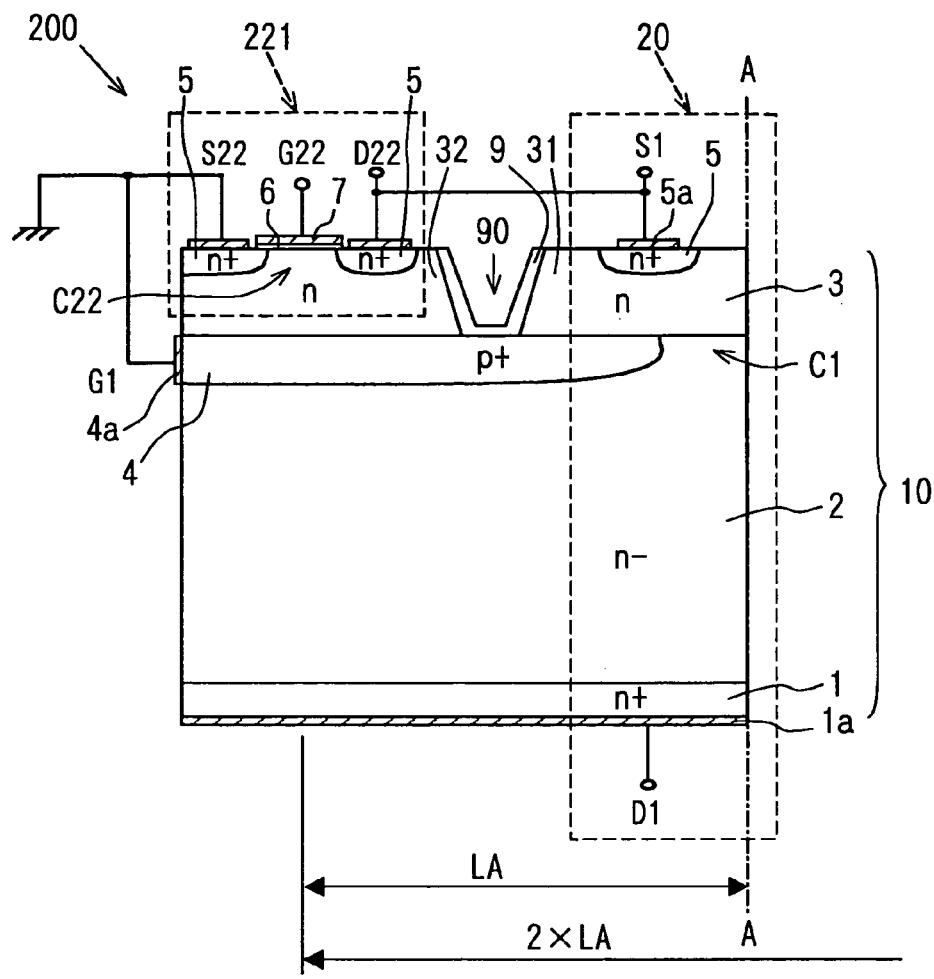
FIG. 10 is a cross-sectional view showing a semiconductor device according to a second embodiment of the present invention.
Figure 11:
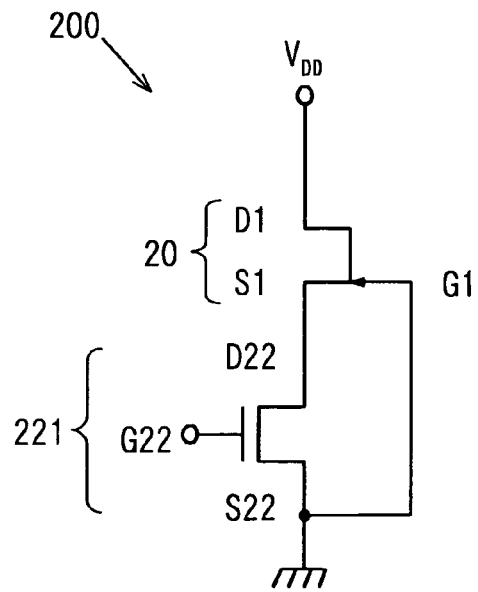
FIG. 11 is an equivalent circuit diagram of the device according to the second embodiment.

A semiconductor device 200 according to a second embodiment of the present invention includes the V-JFET and a lateral type accumulation mode MOSFET (i.e., ACCUFET), which are integrated in the semiconductor substrate made of silicon carbide. The device 200 is shown in FIGS. 10 and 11. The device 200 has almost the same construction as the device 100 shown in FIG. 1. The V-JFET 20 of the device 200 works almost the same as the V-JFET 20 of the device 100. Here, the gate electrode 4a corresponding to the gate G1 of the V-JFET 20 is schematically described to be disposed on the sidewall of the substrate 10. However, the actual gate electrode 4a is formed in a via hole disposed in the insulator 9 at a predetermined position so that the gate electrode 4a connects to the P+ impurity diffusion region 4.

In the ACCUFET 221, two N+ type impurity diffusion regions 5 separately disposed in a surface portion of the third layer 3 work as a source S22 and a drain D22, respectively. A gate electrode 7 corresponding to a gate G22 of the ACCUFET 221 is formed on the third layer 3 through an insulation film 6. The gate electrode 7 is disposed between two N+ impurity diffusion regions 5, i.e., the source S22 and the drain D22. A channel C22 of the ACCUFET 221 is disposed in the surface portion of the third layer 3. Specifically, the channel C22 is disposed between the source S22 and the drain D22.

The drain D22 of the ACCUFET 221 connects to the source S1 of the V-JFET 20. Further, the source S22 of the ACCUFET 221 connects to the gate G1 of the V-JFET 20, so that the gate G1 of the V-JFET 20 is applied with an inverse bias voltage. Thus, the V-JFET 20 is controlled with the ACCUFET 221.

In the device 200, the ACCUFET 221 works in the normally-off operation, and the V-JFET 20 works in the normally-on operation. Therefore, the device 200 provided by a combination of the ACCUFET 221 and the V-JFET 20 totally works in the normally-off operation, and works as a three-terminal device. The device 200 is provided by a single chip, which is composed of one substrate 10 made of SiC. Accordingly, a package for accommodating the device 200 can be minimized, and conduction loss of a wiring in the device 200 can be reduced. Further, since the device 200 does not include Si based device such as Si-MOSFET, the device 200 can work sufficiently in high temperature atmosphere, for example, at a temperature higher than 200° C. Further, the device 200 has a simple construction compared with a device composed of two V-JFETs. Therefore, a manufacturing cost of the device 200 is comparatively small. Further, production tolerance of the device 200 is also small, and the device 200 shows high performance.

The method for manufacturing the device 200 is almost the same as that of the device 100 shown in FIGS. 7A to 9B. Additionally, the gate electrode 7 and the insulation film 6 for providing the gate G22 of the ACCUFET 221 is additionally increased.

The separation 90 is disposed in the third layer 3. Therefore, the separation 90 prevents a mutual interference between the V-JFET 20 and the ACCUFET 221. Further, the P+ impurity diffusion region 4 covers almost the whole area of the boundary between the second layer 2 and the third layer 3 except for the channel C1 of the V-JFET 20. Therefore, the P+ impurity diffusion region 4 separates the second region 32 from the second layer 2. Accordingly, a noise generated in the V-JFET 20 is prevented from penetrating into the second region 32, so that the ACCUFET 221 disposed in the second region 32 is protected from the noise.

As shown in FIG. 11, the ACCUFET 221 works in a low voltage compared with the V-JFET 20. Specifically, the ACCUFET 221 working in the low voltage controls the V-JFET 20 having the high withstand voltage and the low ON-state resistance. Thus, the device 200, as a whole, has high withstand voltage and is easily controlled. Further, the device 200 is the three terminal device having high performance, and works in the normally-off operation.

(Third Embodiment)

Figure 12:
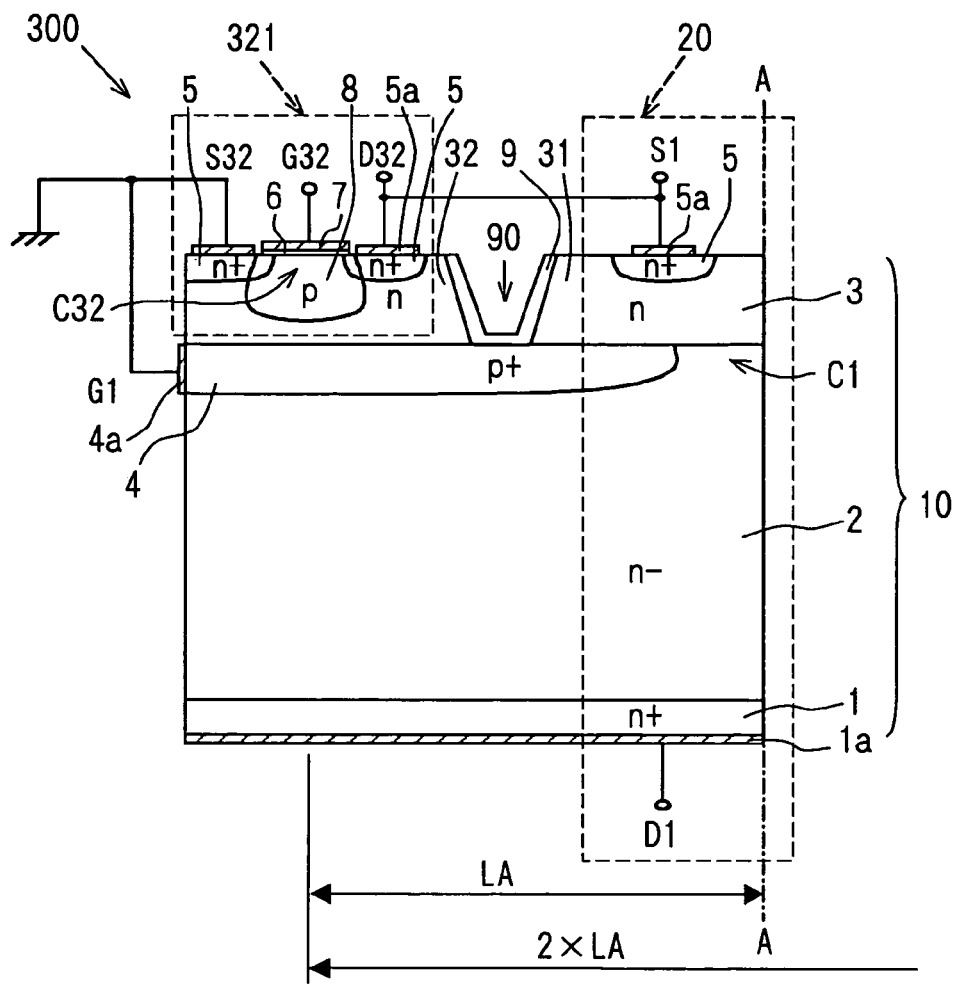
FIG. 12 is a cross-sectional view showing a semiconductor device according to a third embodiment of the present invention.
Figure 13:
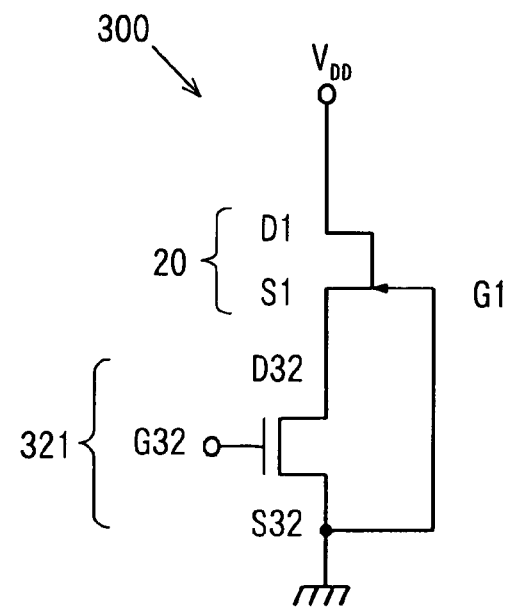
FIG. 13 is an equivalent circuit diagram of the device according to the third embodiment.

A semiconductor device 300 according to a third embodiment of the present invention includes the V-JFET and a lateral type inverse mode MOSFET (i.e., INVFET), which are integrated in the SiC substrate 10. The device 300 is shown in FIGS. 12 and 13. The device 300 has almost the same construction as the device 100 shown in FIG. 1. The V-JFET 20 of the device 300 works almost the same as the V-JFET20 of the device 100. Here, the gate electrode 4a corresponding to the gate G1 of the V-JFET 20 is schematically described to be disposed on the sidewall of the substrate 10. However, the actual gate electrode 4a is formed in a via hole disposed in the insulator 9 at a predetermined position so that the gate electrode 4a connects to the P+ impurity diffusion region 4.

In the device 300, a P type impurity diffusion region 8 including P type impurities in moderate concentration is disposed in the surface portion of the N type third layer 3.

In the INVFET 321, two N+ type impurity diffusion regions 5 separately disposed in a surface portion of the third layer 3 work as a source S32 and a drain D32, respectively.

The two N+ type impurity diffusion regions 5 contact the P type impurity diffusion region 8. The gate electrode 7 corresponding to a gate G32 of the INVFET 321 is formed on the P type impurity diffusion region 8 through the insulation film 6. The gate electrode 7 is disposed between two N+ impurity diffusion regions 5, i.e., the source S32 and the drain D32. A channel C32 of the INVFET 321 is disposed in the surface portion of the third layer 3. Specifically, the channel C32 is disposed between the source S32 and the drain D32.

The drain D32 of the INVFET 321 connects to the source S1 of the V-JFET 20. Further, the source S32 of the INVFET 321 connects to the gate G1 of the V-JFET 20. Thus, the V-JFET 20 is controlled with the INVFET 321.

In the device 300, the INVFET 321 works in the normally-off operation, and the V-JFET 20 works in the normally-on operation. Therefore, the device 300 provided by a combination of the INVFET 321 and the V-JFET 20 totally works in the normally-off operation, and works as a three-terminal device. The device 300 is provided by a single chip, which is composed of one SiC substrate 10. Accordingly, a package for accommodating the device 300 can be minimized, and conduction loss of a wiring in the device 300 can be reduced. Further, the device 300 can work sufficiently in high temperature atmosphere. Further, the device 300 has a simple construction, so that a manufacturing cost of the device 300 is comparatively small. Further, production tolerance of the device 300 is also small, and the device 300 shows high performance.

The method for manufacturing the device 300 is almost the same as that of the device 100 shown in FIGS. 7A to 9B. However, in the process shown in FIG. 8B, the N+ type impurity diffusion region 5 and the P type impurity diffusion region 8 are formed in the third layer 3. The P type impurity diffusion region 8 is formed such that P type impurities are moderately doped into a predetermined area of a surface of the silicon carbide layer 3 with using the ion implantation method. The P type impurity diffusion region 8 is disposed in the surface of the third layer 3. Further, the gate electrode 7 and the insulation film 6 for providing the gate G32 of the INVFET 321 is added. The gate G32 corresponds to the P type impurity diffusion region 8.

The separation 90 is disposed in the third layer 3. Therefore, the separation 90 prevents a mutual interference between the V-JFET 20 and the INVFET 321. Further, the P+ impurity diffusion region 4 covers almost the whole area of the boundary between the second layer 2 and the third layer 3 except for the channel C1 of the V-JFET 20. Therefore, the P+ impurity diffusion region 4 separates the second region 32 from the second layer 2. Accordingly, a noise generated in the V-JFET 20 is prevented from penetrating into the second region 32, so that the INVFET 321 disposed in the second region 32 is protected from the noise.

As shown in FIG. 13, the INVFET 321 works in a low voltage compared with the V-JFET 20. Specifically, the INVFET 321 working in the low voltage controls the V-JFET 20 having the high withstand voltage and the low ON-state resistance. Thus, the device 300, as a whole, has high withstand voltage and is easily controlled. Further, the device 300 is a three terminal device having high performance, and works in the normally-off operation.

(Modifications)

Although the device 100 having the equivalent circuit shown in FIG. 2 includes the L-JFET 21, the device 100 can have the ACCUFET 221 shown in FIG. 10 instead of the L-JFET 21. In this case, the ACCUFET 221 has a wire connection shown in FIG. 2, which is different from a wire connection shown in FIG. 11. Thus, the device 100 with the ACCUFET 221 has high performance, and is manufactured at low cost.

Further, although the device 100 including the L-JFET 21 is controlled with the Si-MOSFET 40 shown in FIG. 6, the device 100 having the ACCUFET 221 shown in FIG. 10 instead of the L-JFET 21 can be controlled with the Si-MOSFET 40. In this case, the ACCUFET 221 has a wire connection shown in FIG. 6, which is different from the wire connection shown in FIG. 11. Thus, a whole circuit in the device 100 including the ACCUFET 221 with the Si-MOSFET 40 is minimized.

Although the device 200 having the equivalent circuit shown in FIG. 11 includes the ACCUFET 221, the device 200 can have the L-JFET 21 shown in FIG. 1 instead of the ACCUFET 221. In this case, the L-JFET 21 has a wire connection shown in FIG. 11, which is different from a wire connection shown in FIG. 2. Thus, the device 200 with the L-JFET 21 has high performance, and is manufactured at low cost. In this case, the gate G2 of the L-JFET 21 and the gate G1 of the V-JFET 20 are required to separate each other. Therefore, the P+ type impurity diffusion region 4 is not formed integrally such as the device 100 shown in FIG. 1, but one part of the P+ type impurity diffusion region 4 corresponding to the V-JFET 20 and the other part of the P+ type impurity diffusion region 4 corresponding to the L-JFET 21 are separated.

Although the device 300 having the equivalent circuit shown in FIG. 13 includes the INVFET 321, the device 300 can have the L-JFET 21 shown in FIG. 1 instead of the INVFET 321. In this case, the L-JFET 21 has a wire connection shown in FIG. 13, which is different from the wire connection shown in FIG. 2. Thus, the device 300 with the L-JFET 21 has high performance, and is manufactured at low cost. In this case, the gate G2 of the L-JFET 21 and the gate G1 of the V-JFET 20 are required to separate each other. Therefore, the P+ type impurity diffusion region 4 is not formed integrally such as the device 100 shown in FIG. 1, but one part of the P+ type impurity diffusion region 4 corresponding to the V-JFET 20 and the other part of the P+ type impurity diffusion region 4 corresponding to the L-JFET 21 are separated.

Although the separation 90 is formed in the third layer in the device 100, 200, 300, the separation 90 may be removed in a case where the V-JFET 20 does not mutually interfere the L-JFET 21, the ACCUFET 221 or the INVFET 321 substantially.

Although the P+ impurity diffusion region 4 in the device 100, 200, 300 covers almost the whole area of the boundary between the second layer 2 and the third layer 3 except for the channel C1 of the V-JFET 20, the P+ impurity diffusion region 4 can be partly formed (i.e., the region 4 is not required to cover almost the whole area) in a case where the V-JFET 20 does not mutually interfere the L-JFET 21, the ACCUFET 221 or the INVFET 321 substantially.

Such changes and modifications are to be understood as being within the scope of the present invention as defined by the appended claims.

What is claimed is:

1. A semiconductor device comprising:
   a first field effect transistor including a source and a gate and disposed in a silicon carbide substrate; and
   a second field effect transistor including a drain and a gate and disposed in the substrate,
   wherein the first field effect transistor is a vertical type junction field effect transistor having the source, the gate, a drain and a channel, wherein the second field effect transistor is a lateral type junction field effect transistor having a source, the gate, the drain and a channel, wherein the drain of the second field effect transistor connects to the source of the first field effect transistor, wherein the gate of the second field effect transistor connects to the gate of the first field effect transistor, wherein the source of the vertical type junction field effect transistor is disposed on an opposite side of the drain of the vertical type junction field effect transistor, and wherein the source of the lateral type junction field effect transistor is disposed on a same side of the drain of the lateral type junction field effect transistor.

2. The device according to claim 1, further comprising:

a metal-oxide semiconductor field-effect transistor including a drain and a source and disposed in the silicon carbide substrate, wherein the drain of the metal-oxide semiconductor field-effect transistor connects to the source of the second field effect transistor, and wherein the source of the metal-oxide semiconductor field-effect transistor connects to the gate of the second field effect transistor.

3. The device according to claim 2, wherein the metal-oxide semiconductor field-effect transistor becomes an on-state in a case where the gate of the metal-oxide semiconductor field-effect transistor is applied with a gate voltage in a range between 5 volts and 10 volts.

4. A semiconductor device comprising:

a first field effect transistor including a source and a gate and disposed in a silicon carbide substrate; and a second field effect transistor including a drain and a gate and disposed in the substrate, wherein the drain of the second field effect transistor connects to the source of the first field effect transistor, wherein the gate of the second field effect transistor connects to the gate of the first field effect transistor, wherein the substrate includes:

a first layer made of silicon carbide and heavily doped with a first impurity having a first type conductivity;

a second layer made of silicon carbide and lightly doped with the first impurity; and a third layer made of silicon carbide and moderately doped with the first impurity, wherein the second layer is disposed on the first layer, and the third layer is disposed on the second layer, wherein the substrate further includes:

a first impurity diffusion region heavily doped with the first impurity; and a second impurity diffusion region heavily doped with a second impurity having a second type conductivity, wherein the second impurity diffusion region is disposed in the second layer near a boundary between the second layer and the third layer, and covers a predetermined area of the boundary, wherein the third layer has first, second and third surface portions, and the first impurity diffusion region is disposed in each of the first, second and third surface portions of the third layer, wherein the first field effect transistor is a vertical type junction field effect transistor having the source, the gate, a drain and a channel, wherein the source of the first field effect transistor is the first impurity diffusion region disposed in the first surface portion, the drain of the first field effect transistor is the first layer, the gate of the first field effect transistor is the second impurity diffusion region, and the channel of the first field effect transistor is a part of the second layer near the boundary between the second layer and the third layer, the part of the second layer not being covered with the second type impurity diffusion region, wherein the second field effect transistor is a lateral type junction field effect transistor having a source, the gate, the drain and a channel, wherein the source of the second field effect transistor is the first impurity diffusion region disposed in the second surface portion, the drain of the second field effect transistor is the first impurity diffusion region disposed in the third surface portion, the gate of the second field effect transistor is the second impurity diffusion region, and the channel of the second field effect transistor is the third layer, and wherein the second surface portion separates from the third surface portion.

5. The device according to claim 4, further comprising:

a separation disposed in the third layer and reaches the second impurity diffusion region, wherein the separation separates the third layer into a first part and a second part, and wherein the source of the first field effect transistor is disposed in the first part, and the second field effect transistor is disposed in the second part.

6. The device according to claim 5, wherein the second impurity diffusion region covers almost whole area of the boundary between the second layer and the third layer except for the channel of the first field effect transistor, and wherein the second impurity diffusion region separates between the second part and the second layer.

* * * * *